United States Patent [19]
Yamada et al.

[11] Patent Number: 5,382,546
[45] Date of Patent: Jan. 17, 1995

[54] SEMICONDUCTOR DEVICE AND METHOD OF FABRICATING SAME, AS WELL AS LEAD FRAME USED THEREIN AND METHOD OF FABRICATING SAME

[75] Inventors: Tomio Yamada, Gunma; Akio Hoshi, Isesaki, both of Japan

[73] Assignee: Hitachi, Ltd., Tokyo, Japan

[21] Appl. No.: 150,344

[22] Filed: Nov. 10, 1993

Related U.S. Application Data

[63] Continuation of Ser. No. 31,424, Mar. 15, 1993, abandoned.

[30] Foreign Application Priority Data

Mar. 23, 1992 [JP] Japan ................... 4-095852

[51] Int. Cl.⁶ ............................................ H01L 21/60
[52] U.S. Cl. .................... 437/217; 437/209; 437/214; 437/220
[58] Field of Search ............... 437/209, 211, 214, 217, 437/220; 257/666, 667, 668, 672, 669, 674

[56] References Cited

U.S. PATENT DOCUMENTS

| | | | |
|---|---|---|---|
| 4,259,436 | 3/1981 | Tabuchi et al. | 437/217 |
| 4,308,339 | 12/1981 | Lindberg | 437/217 |
| 4,987,473 | 1/1991 | Johnson | 257/666 |
| 5,070,039 | 12/1991 | Johnson et al. | 437/214 |
| 5,099,306 | 3/1992 | Dunaway et al. | 257/666 |
| 5,140,404 | 8/1992 | Fogal et al. | 437/220 |
| 5,202,288 | 4/1993 | Doering et al. | 437/220 |
| 5,206,188 | 4/1993 | Hiroi et al. | 437/217 |

FOREIGN PATENT DOCUMENTS

| | | |
|---|---|---|
| 138870 | 11/1977 | Japan . |
| 180061 | 7/1990 | Japan . |
| 27563 | 2/1991 | Japan . |

*Primary Examiner*—Tom Thomas
*Assistant Examiner*—Kevin M. Picardat
*Attorney, Agent, or Firm*—Pennie & Edmonds

[57] ABSTRACT

In a semiconductor device having a number of pins, there is used an inner lead group comprising a group of upper inner leads 7A present in an upper plane and a group of lower inner leads 7B in a lower plane, the upper inner lead group and the lower inner lead group being laminated together in an insulated from each other through an insulating layer 2C, both end portions in the circumferential direction of each upper inner lead 7A being overlapped with circumferential ends of adjacent lower inner leads 7B, 7B located on both sides of the upper inner lead, and bonding areas 8A of the upper inner leads 7A being positioned radially outwards with respect to bonding areas 8B of the lower inner leads 7B, whereby the pitch between inner leads can be reduced to half, and the number of pins can be increased under the condition that the size of a resin sealing body 24 is fixed. Further, wire bonding can be done properly because a reaction force induced at the time of wire bonding for the upper inner leads 7A is borne at the overlapped portions of the lower inner leads 7B, 7B.

11 Claims, 16 Drawing Sheets

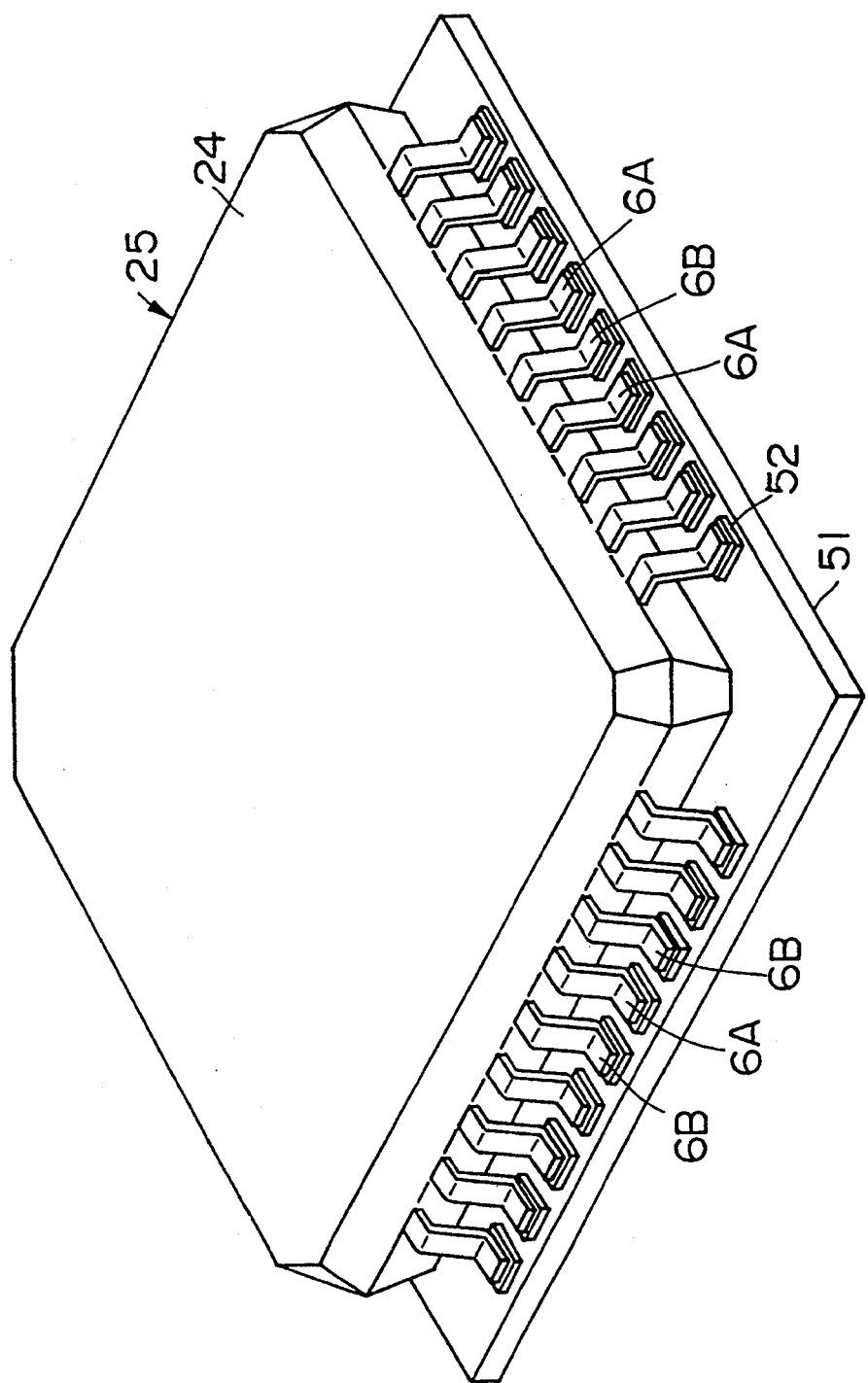

SEMICONDUCTOR DEVICE AND METHOD OF FABRICATING SAME, AS WELL AS LEAD FRAME USED THEREIN AND METHOD OF FABRICATING SAME

This is a continuation of application Ser. No. 08/031,424, filed Mar. 15, 1993, now abandoned.

BACKGROUND OF THE INVENTION

The present invention relates to a semiconductor device manufacturing technique, particularly a technique for manufacturing a semiconductor device using a lead frame, for example, a technique which is effectively applicable to a semiconductor integrated circuit device having a large number of pins.

Generally, as package forms of a semiconductor integrated circuit device (hereinafter referred to as "IC") having a large number of pins, there are widely known a ceramic pin grid array package ("PGA" hereinafter) and a plastic quad flat package ("QFP" hereinafter).

However, a PGA IC obtained by putting an IC chip on a substrate with a large number of pins inserted therein followed by hermetic sealing is expensive, and since it is an insertion type, the mounting workability is inferior.

On the other hand, in the case of an IC having a surface-mounted type resin sealed package typical of which is a QFP IC, since inner and outer leads are formed by processing a single lead frame, a limit is encountered in point of increasing the number of pins.

More particularly, since a metallic sheet having a thickness of about 0.1 to 0.2 mm is used as a lead frame and is subjected to pressing or etching to form inner and outer lead portions, there is a limit in reducing the size between adjacent inner leads, depending on conditions for the processing, e.g. processing accuracy.

Heretofore, in view of the above-mentioned points and in connection with the technique for fabricating an IC provided with a resin sealed package which permits increasing the number of pins, there has been proposed the semiconductor device disclosed in Japanese Patent Laid Open No. 27563/91.

The semiconductor device is characterized in that plural lead frames are laminated together through an insulating film which is disposed between adjacent lead frames, inner leads of each lead frame are disposed on a plane in a deviated state in the lead arrangement direction, and a semiconductor device mounted on one lead frame is connected with the inner leads electrically through bonding wires.

SUMMARY OF THE INVENTION

In the semiconductor device disclosed in the Japanese patent laid open 27563/91, however, the inner leads on the upper side are each disposed between adjacent inner leads on the lower side and in this state they are positioned on the insulating layer. Consequently, according to a finding made by the present inventor, in the case of bonding wire to each upper inner lead, a support member for the upper inner lead through the insulating layer is required between the adjacent lower inner leads, so actually it is impossible to effect wire bonding for the upper inner leads.

In the Japanese patent laid open 27563/91, moreover, a method for manufacturing the semiconductor device disclosed therein is not concretely described therein, so it is impossible to practice it actually.

It is an object of the present invention to provide a semiconductor device manufacturing technique capable of affording a semiconductor device having a resin sealer which permits increasing the number of pins, and also capable of realizing the manufacture thereof.

It is another object of the present invention to provide a lead frame for the above multi-pin semiconductor device and a method for fabricating the same.

The above and other objects and novel features of the present invention will become apparent from the following description and the accompanying drawings.

Of the inventions disclosed herein, typical inventions will be outlined below.

(1) A semiconductor device including a semiconductor pellet with an electronic circuitry formed therein, a tab (a pellet mounting portion) to which is bonded the semiconductor pellet, a plurality of inner leads each connected electrically to the semiconductor pellet, a group of wires connected bridgewise between the inner leads and the semiconductor pellet, a group of outer leads contiguous respectively to the inner leads in an integral manner, and a resin sealer for resin-molding the semiconductor pellet, group of inner leads and group of wires, characterized in that: the group of inner leads comprises a group of upper inner leads disposed in an upper plane and a group of lower inner leads disposed in a lower plane, the upper and lower inner lead groups being laminated together in an insulated from each other through an insulating layer; between adjacent lower inner leads, both end portions in the circumferential direction of each upper inner lead at least in a wire bonding area, namely, the innermost end and both side portions of the upper inner lead, overlap circumferential end portions of the lower inner leads located on both sides of the upper inner lead; and that a bonding area of each upper inner lead is positioned radially outwards with respect to a bonding area of each lower inner lead.

(2) A method of fabricating a semiconductor device, comprising the steps of:

providing a laminated lead frame comprising a first lead frame and a second lead frame, the first and second lead frames each comprising plural inner leads and plural outer leads contiguous respectively to the inner leads in an integral manner, the inner leads each including a bonding area defined by a proximal end portion and side portions of the inner lead, the first and second lead frames being laminated to each other through an insulating layer at least between the inner leads of both lead frames;

providing a semiconductor pellet having an electronic circuitry formed in a main surface thereof and with plural electrodes disposed thereon;

connecting the plural electrodes with the bonding areas of the inner leads of the first and second lead frames electrically using plural wires; and molding the inner leads of the first and second lead frames, the insulating layer and the semiconductor pellet, using resin, wherein at least the bonding area of each inner lead of the first lead frame is positioned above two adjacent inner leads of the second lead frame so that its side portions overlap the said two adjacent inner leads of the second lead frame.

(3) In the above method (2), wire bonding for the first lead frame is carried out after the execution of wire bonding for the second lead frame.

(4) In the sealing process of the above method (2), the outer leads of the first lead frame are pressed in the same plane by upper and lower molds.

(5) A method of fabricating a lead frame, comprising the steps of:

providing a laminate comprising a first conductor layer and a second conductor layer formed respectively on both sides of an insulating layer;

etching the first and second conductor layers to form a laminated lead frame comprising first and second lead frames, the first and second lead frames each comprising plural inner leads and plural outer leads contiguous respectively to the inner leads in an integral manner, the inner leads each including a bonding area defined by a proximal end portion and side portions thereof; and etching the insulating layer to expose the bonding areas of the second lead frame, wherein at least the bonding area of each inner lead of the first lead frame is positioned above two adjacent inner leads of the second lead frame so that its side portions overlap the said two adjacent inner leads of the second lead frame.

(6) In the conductor layer etching process of the above method (5), the first and second conductor layers are etched toward the insulating layer from the respective sides opposite to the sides which are in contact with the insulating layer.

According to the above means, since the inner lead group comprises upper inner leads in an upper plane and lower inner leads in a lower plane and the upper and lower inner leads are arranged in an alternate fashion, it is possible to reduce the pitch size between inner leads to half. Consequently, under the condition of a fixed package size, it is possible to increase the number of pins.

Moreover, between adjacent lower inner leads, both end portions in the circumferential direction of each upper inner lead at least in the wire bonding area overlap circumferential end portions of the lower inner leads located on both sides of the upper inner lead, so when wire bonding is performed for the upper inner lead, the resulting reaction force is borne at the overlapped portions of the lower inner leads, thus permitting execution of the wire bonding.

Further, since a resin sealer is used, it is possible to greatly reduce the manufacturing cost in comparison with PGA.

BRIEF DESCRIPTION OF THE DRAWINGS

FIG. 2 is a perspective view showing a mounted state of the QFP IC;

DESCRIPTION OF THE PREFERRED EMBODIMENTS

Figure 1A:
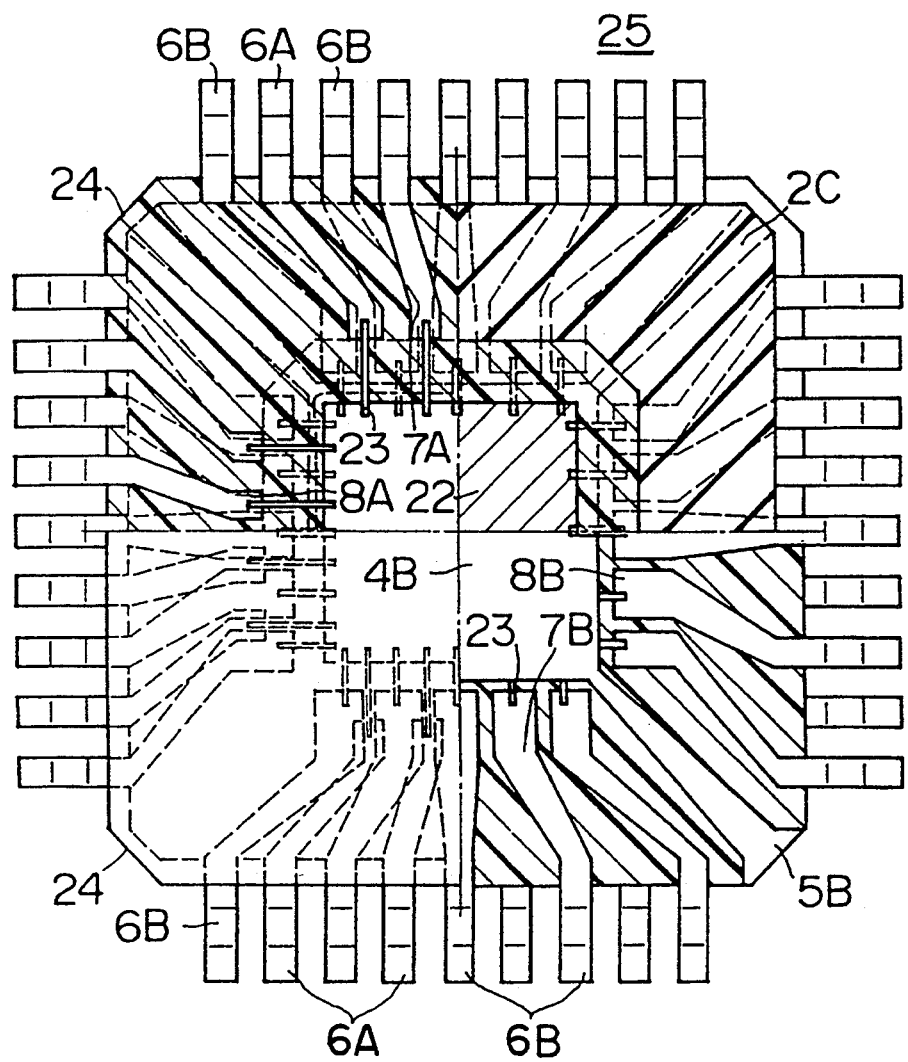
FIG. 1 comprises
(a) a partially cut-away plan view and
(b) a front sectional view, showing a QFP IC embodying the present invention.
Figure 3A:
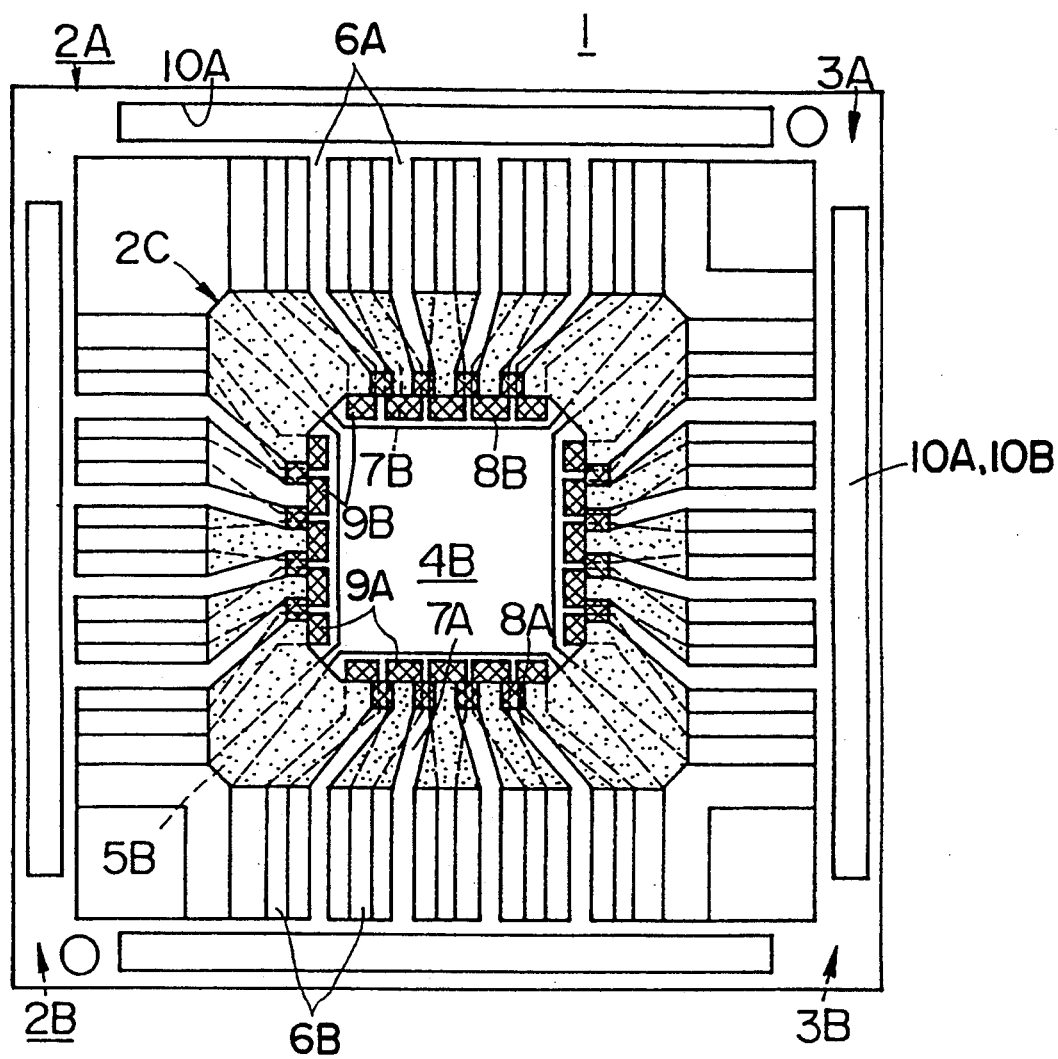
FIG. 3 is a view showing a laminated lead frame embodying the present invention, in which
(a) is a plan view and
(b) is a front sectional view.
Figure 3B:
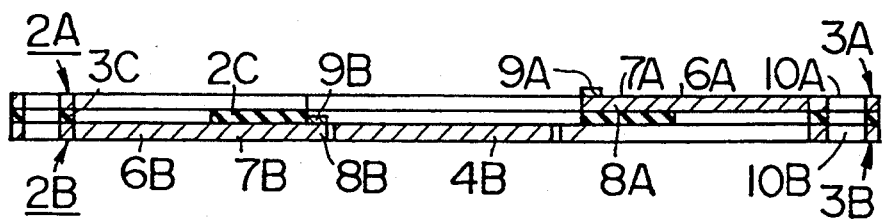

FIGS. 1(a) and (b) are a partially cut-away plan view and a front sectional view, respectively, showing a QFP IC embodying the present invention, FIG. 2 is a perspective view showing a mounted state thereof, and FIGS. 3 et seq. are explanatory views showing a semiconductor device fabricating method embodying the invention.

In the embodiment to be described, a semiconductor device according to the present invention is constituted as a QFP IC 25.

The QFP IC 25 includes a semiconductor pellet 22 having an electronic circuitry formed in a main surface thereof and with plural electrodes (bonding pads) formed thereon; a plurality of inner leads 7A and 7B disposed radially around the semiconductor pellet 22; a group of wires 23 which provide electrical connections between the inner leads 7A, 7B and the semiconductor pellet 22; a group of outer leads 6A and 6B which are contiguous leads 7A and 7B; and a resin body 24 for sealing the semiconductor pellet 22, inner leads 7A, 7B and wires 23, using resin.

The inner lead group comprises a group of upper inner leads 7A located in an upper plane and a group of lower inner leads 7B located in a lower plane, the upper and lower inner lead groups 7A, 7B being laminated together in an insulated from each other through an insulating layer 2C.

Between adjacent lower inner leads 7B and 7B, both end portions in the circumferential direction of each upper inner lead 7A at least in a wire bonding area overlap circumferential end portions of the lower inner leads 7B, 7B located on both sides of the upper inner lead.

Further, the upper inner leads 7A are laminated to the lower inner leads 7B stepwise in an insulated from the lower inner leads and in a radially outwardly deviated of their proximal end portions. One ends of the wires 23 are electrically connected to bonding areas 8A and 8B which are defined by the innermost ends and both side portions of the upper and lower inner leads 7A and 7B, respectively, whereby the inner leads are electrically connected to the semiconductor pellet 22.

On the other hand, the outer leads 6A and 6B are projected at right angles in the same plane from the side faces of the resin sealing body 24, and their mounting surfaces formed on the undersides of their outermost end portions are arranged in the shape of a square frame at the outside of the resin sealing body 24 so as to be substantially flush with the said undersides.

The QFP IC 25 having the above construction is fabricated in the following manner.

A QFP IC manufacturing method embodying the present invention will be described below, whereby the details of the construction of the QFP IC 25 will be made clear.

In this QFP IC manufacturing method there is used a laminated lead frame 1 embodying the invention and shown in FIG. 3. Although in the following description the laminated lead frame, etc. are explained and illustrated in a single unit, they may be constituted in series.

The laminated lead frame 1 embodying the invention and shown in FIG. 3 includes an upper (first) lead frame 2A, a lower (second) lead frame 2B and an insulating layer 2C. The insulating layer 2C is interposed between the upper and lower lead frames 2A, 2B to insulate both lead frames from each other.

The upper and lower lead frames 2A, 2B have the same constituent elements except a tab (pellet mounting portion) and are formed substantially in the same shape. Therefore, description will first be directed below to constituent elements of the lower lead frame 2B as a typical example.

The lower lead frame 2B has an outer frame 3B which is formed generally in the shape of a square frame. Centrally of the outer frame 3B is concentrically disposed a tab (i.e., die pad) 4B which is formed generally in the shape of a square plate and which is suspended through a plurality of tab suspending leads 5B.

In the outer frame 3B, a plurality of outer leads 6B are provided projectingly in a radially inward direction at right angles to the outer frame so as to be parallel with each other.

Inner leads 7B are integrally contiguous to the innermost ends of the outer leads 6B in such a manner that the pitch between adjacent inner leads 7B and 7B is smaller than that between the outer leads 6B and 6B which are contiguous to them. The inner leads 7B are arrranged on all sides of and in close proximity to the tab 4B, and substantially by their proximal end portions there are formed bonding areas 8B.

On the bonding area 8B of each inner lead 7B is formed a silver plated layer 9B, which is for improving the bondability of wire bonding as will be described later.

On the other hand, the upper lead frame 2A is not formed with a tab. The upper lead frame 2A is disposed concentrically on the lower lead frame 2B and is bonded thereto through the insulating layer 2C.

In this state, the innermost ends of inner leads 7A of the upper lead frame 2A are more retracted radially outwards than the inner leads 7B of the lower lead frame 2B, whereby the bonding areas 8B of the lower lead frame 2B are exposed.

On a bonding area 8A of each inner lead 7A is formed a silver plated layer 9A to improve the bondability of wire bonding which will be described later.

The insulating layer 2C is not formed with a tab, either. The insulating layer 2C is formed in a generally square frame shape on the lower lead frame 2B. In this state, an inner portion 2C (the portion sealed by the resin sealing body 24) of the insulating layer, together with the innermost ends of the inner leads 7A of the upper lead frame 2A, is more retracted radially outwards than the bonding areas 8B of the inner leads 7B, whereby the bonding areas 8B of the lower lead frame 2B are exposed.

In such a laminated state of the lower lead frame 2B, upper lead frame 2A and insulating layer 12C (see FIG. 4), outer frames 3A, 3B of the lead frames 2A, 2B and an outer frame portion 3C of the insulating layer are in a laminated state outside the outer leads 6B and 6A. By these outer frames 3B, 3A and outer frame portion 3C of the insulating layer there substantially is constituted a dam for resin at the time of molding of the resin sealer as will be described later.

Along the outer leads 3A and 3B there are formed elongated slits 10A and 10B. These slits function to absorb stress at the time of bending the outer leads as will be described later.

In this embodiment, between adjacent inner leads 7B and 7B of the lower lead frame 2B, both end portions in the circumferential direction of each inner lead 7A of the upper lead frame 2A at least in the bonding area 8A overlap the circumferential end portions of the lower inner leads located on both sides of the upper inner lead. The amount of this overlap should be set to a value which permits wire bonding for the bonding area 8A of the upper inner lead 7A.

The lead frame manufacturing method embodying the invention will be described below in connection with the fabrication of the laminated lead frame 1 having the above construction, with reference to FIGS. 4 to 8.

Figure 4A:
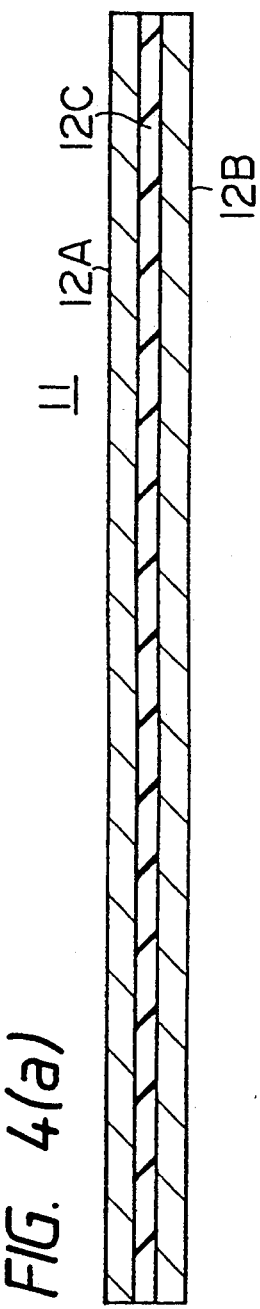
FIG. 4 is a view showing a laminated lead frame fabricating method embodying the present invention, in which
(a) is a front sectional view showing a laminate,
(b) is a front sectional view showing the laminate after the application of resist thereto, and
(c) is a front sectional view showing the laminate after the formation of resist patterns thereon.

According to the manufacturing method for the laminated lead frame 1, there first is fabricated a laminate material 11 shown in FIG. 4(a). The laminate material 11 is an integral laminate of an insulating layer 12C, an upper (first) conductor layer 12A formed on the upper side of the insulating layer 12C, and a lower (second) conductor layer 12B formed on the lower side of the insulating layer 12C.

For example, the insulating layer 12C is formed in the shape of a thin film 50–90 $\mu$m thick using an epoxy resin, and the conductor layers 12A and 12B are each formed in the shape of a thin sheet 90–150 $\mu$m thick using 42 alloy. Both conductor layers 12A and 12B are fixed to the insulating layer 12C by a suitable means such as, for example, adhering, bonding or welding.

Thereafter, a lithography treatment is applied to the laminate material 11, whereby the upper and lower lead frames 2A, 2B and insulating layer 2C in the foregoing construction are formed.

Figure 4B:
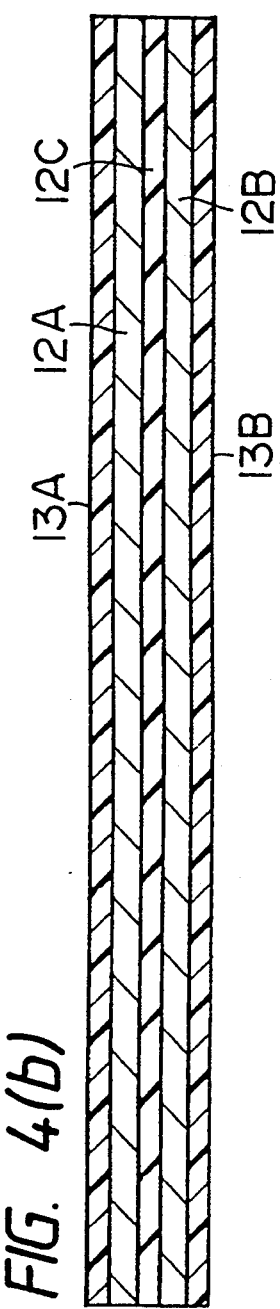

In the lithography step, first as shown in FIG. 4(b), a resist is applied to both the upper (first) and lower (second) conductor layers 12A, 12B of the laminate material 11 to form resist films 13A and 13B.

Figure 4C:
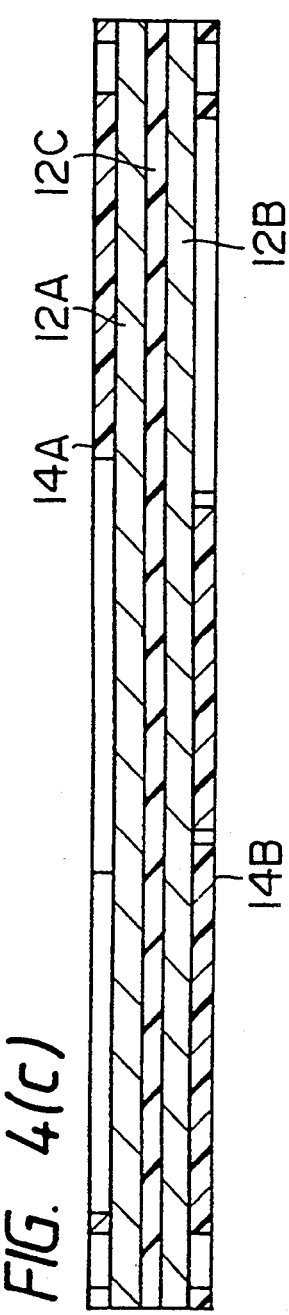

Subsequently, the resist films are exposed to patterns by means of an aligner, followed by development, to form an upper resist pattern 14A and a lower resist patterns 14B on the upper conductor layer 12A and the lower conductor layer 12B, respectively, of the laminate material 11, as shown in FIG. 4(c).

Figure 5A:
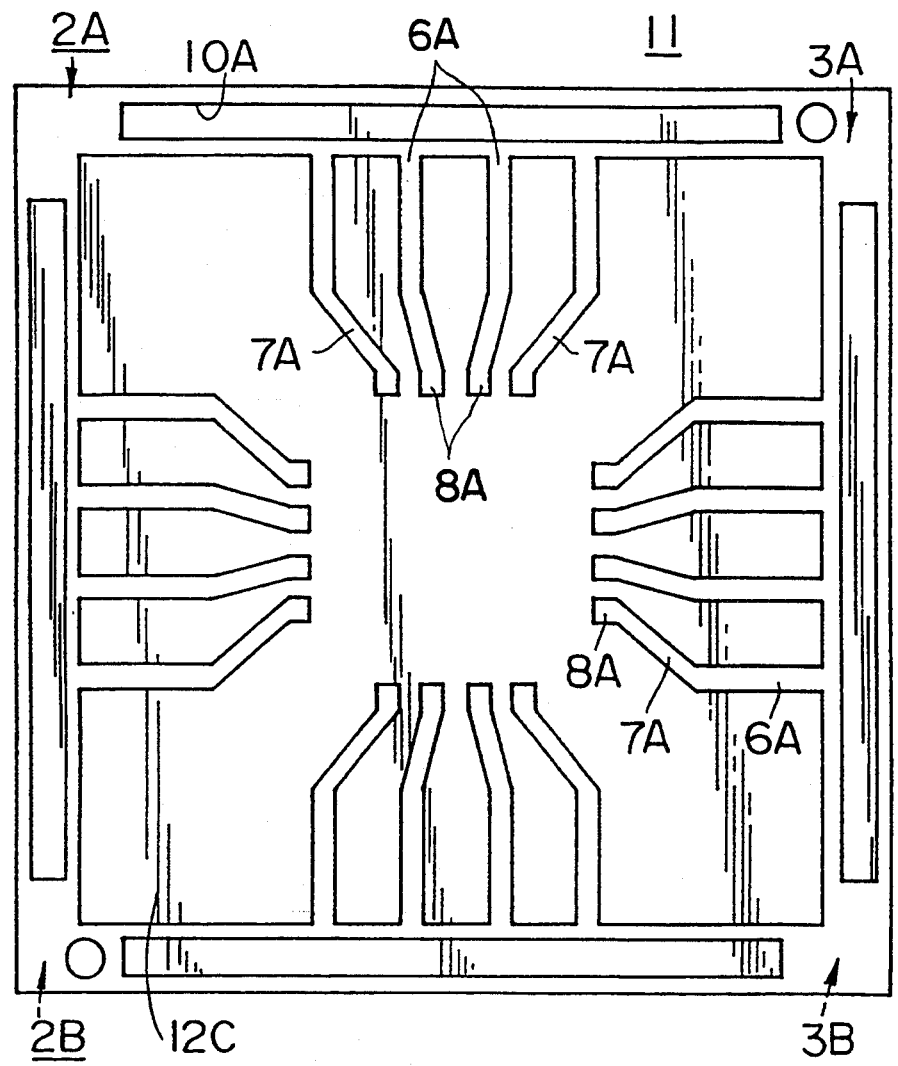
FIG. 5(a) is a plan view of the lead frame after etching and
FIG. 5(b) is a front sectional view thereof.
Figure 5B:
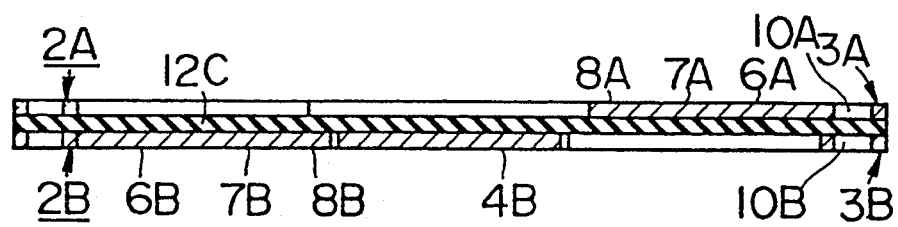

Then, an etching treatment is performed whereby, as shown in FIG. 5, the foregoing upper and lower lead frames 2A, 2B are formed in the upper and lower conductor layers 12A, 12B on the basis of the upper and lower resist patterns 14A, 14B, respectively. In this case, at least inner lead portions 7A and 7B of the lead frames 2A and 2B are etched toward the insulating layer 12C from the sides opposite to the sides on which the upper and lower conductor layers 12A, 12B are bonded to the insulating layer 12C.

Figure 6A:
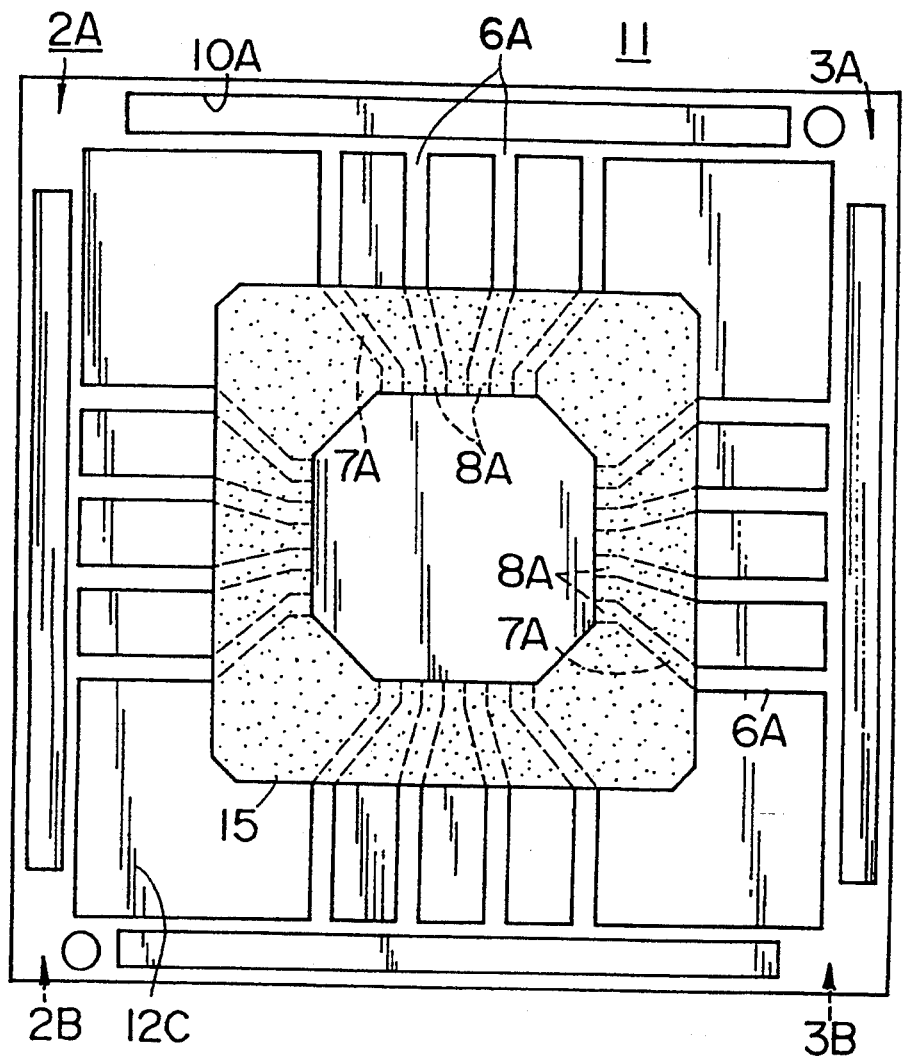
FIG. 6(a) is a plan view of the lead frame after the application of resist thereto and
FIG. 6(b) is a front sectional view thereof.
Figure 6B:
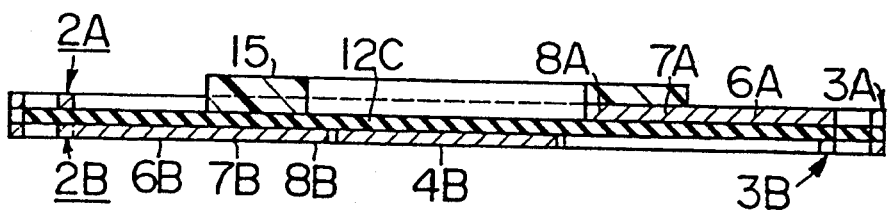

Thereafter, as shown in FIG. 6, a resist film 15 is formed on the upper surface of the insulating layer 12C of the laminate material 11. The resist film 15 can be formed using a simple means such as a metal mask method for example.

Figure 7A:
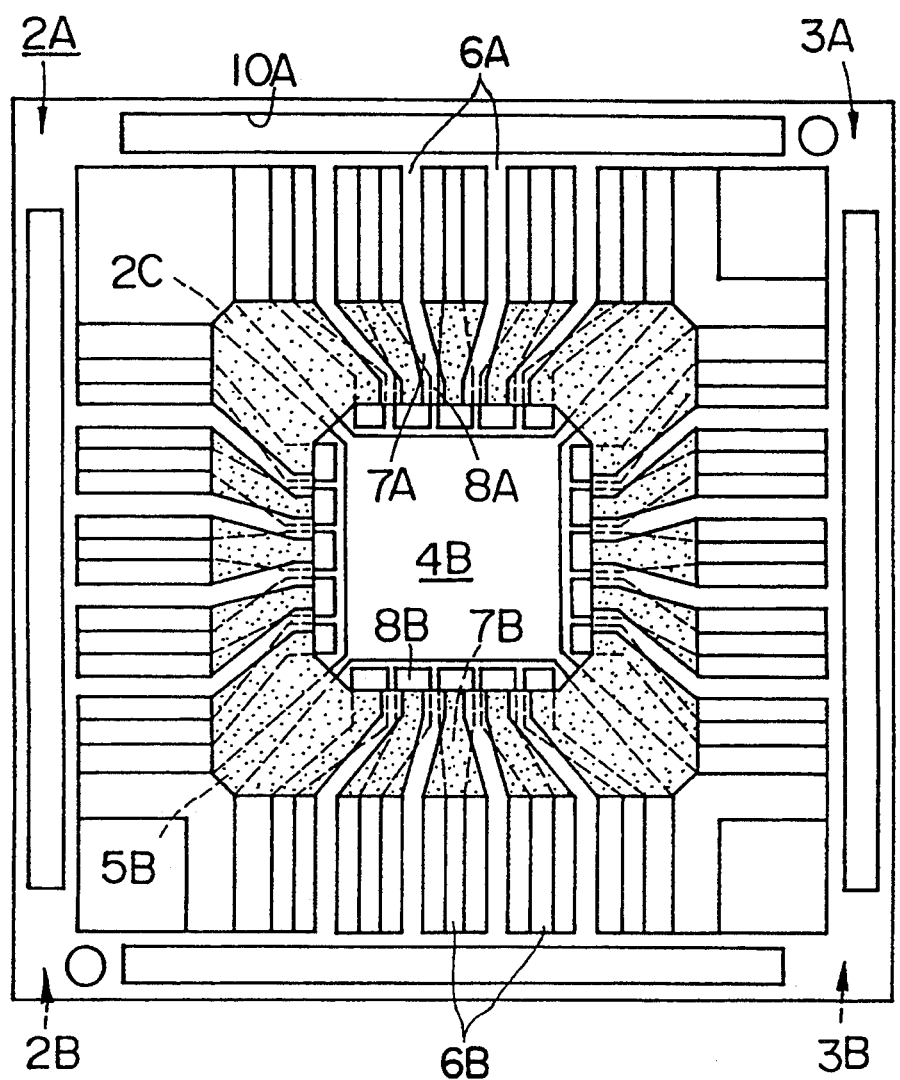
FIG. 7(a) is a plan view showing the lead frame after etching of an insulating film and
FIG. 7(b) is a front sectional view thereof.
Figure 7B:
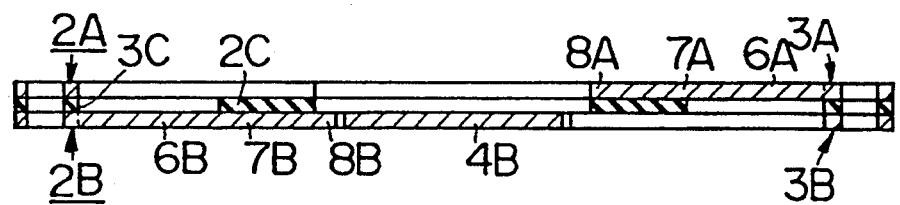

As a result of subsequent etching, as shown in FIG. 7, a tab 4B and bonding areas 8B of the lower lead frame 2B are exposed and formed in the lower conductor layer 12B on the basis of the resist film 15.

Figure 8A:
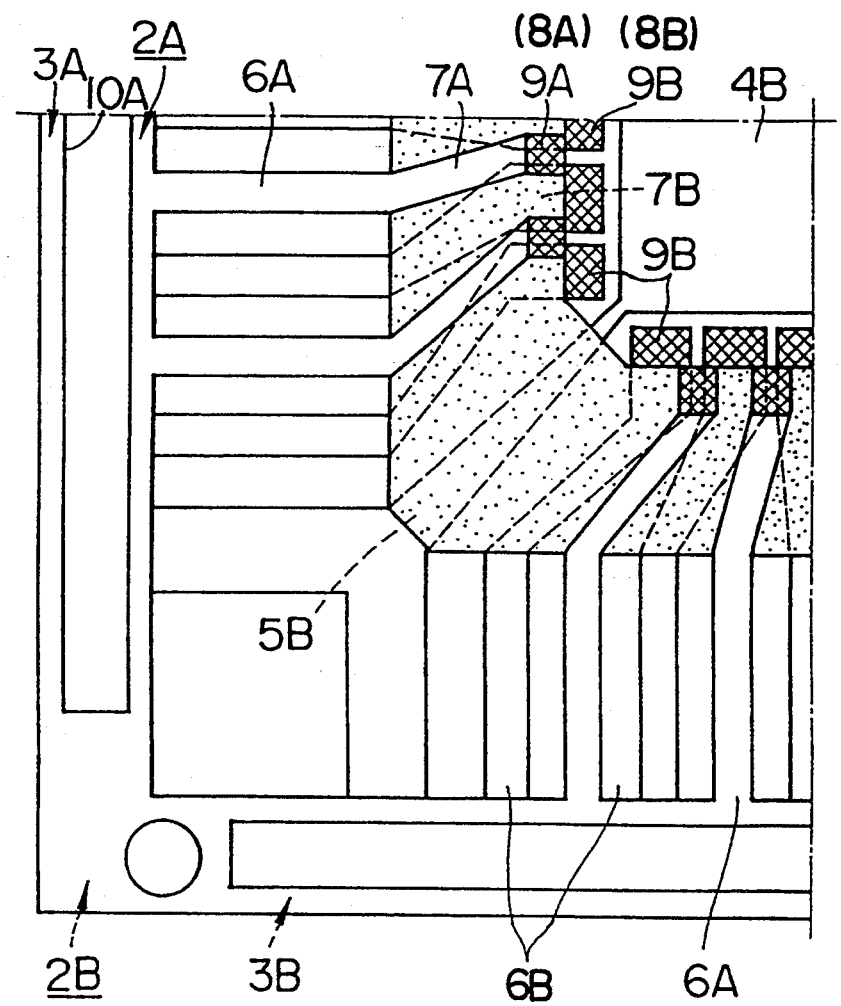
FIG. 8(a) is an enlarged partial plan view of the lead frame after silver plating applied to bonding areas and
FIG. 8(b) is an enlarged, partial, front sectional view thereof.
Figure 8B:
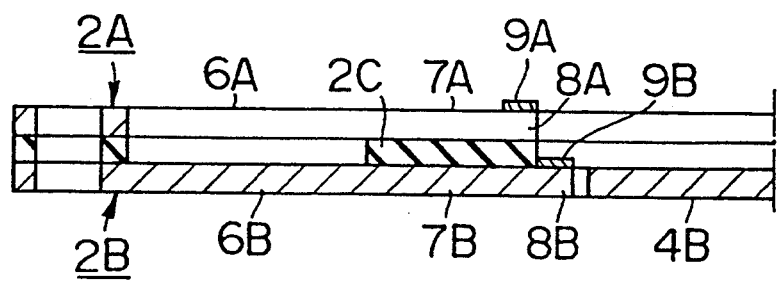

Thereafter, a silver plating treatment is performed whereby, as shown in FIG. 8, silver plated layers 9A and 9B are formed on the bonding areas 8A and 8B, respectively, of the upper and lower inner leads 7A, 7B.

By the above manufacturing method there is now produced the laminated lead frame 1 having the construction described previously.

For the laminated lead frame 1 thus fabricated are then performed pellet bonding and wire bonding in a pellet bonding process and a wire bonding process, respectively.

Figure 9A:
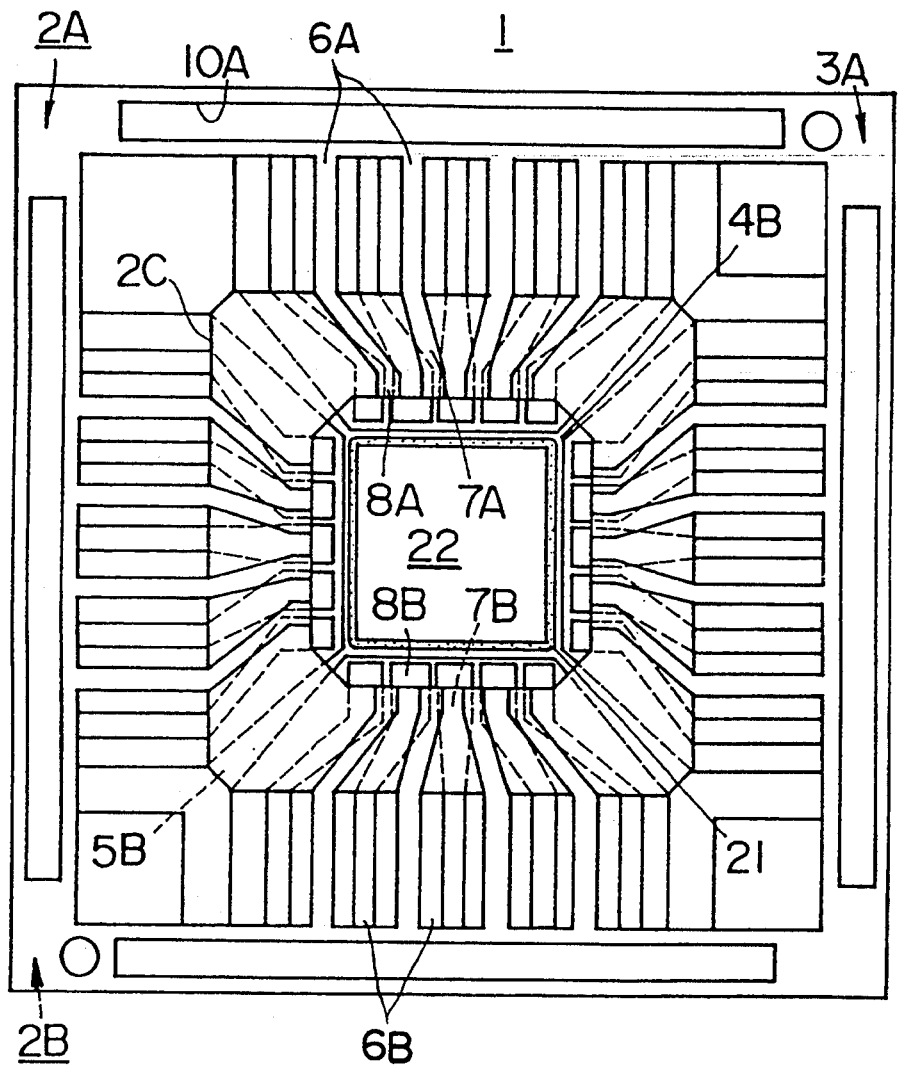
FIG. 9 is a view showing the lead frame after a pellet bonding process in a QFP IC fabricating method embodying the present invention, in which
(a) is a plan view and
(b) is a front sectional view.
Figure 9B:
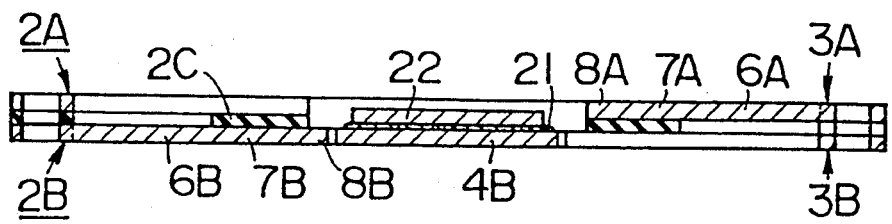

First, in the pellet bonding process, a pellet 22 with an integrated circuit formed in a main surface thereof in a so-called pre-process in the semiconductor device manufacture is disposed concentrically on the tab 4B of the lower lead frame 2B in the laminated lead frame 1 and is bonded thereto by a bonding layer 21 formed of silver paste for example, as shown in FIG. 9.

Figure 10A:
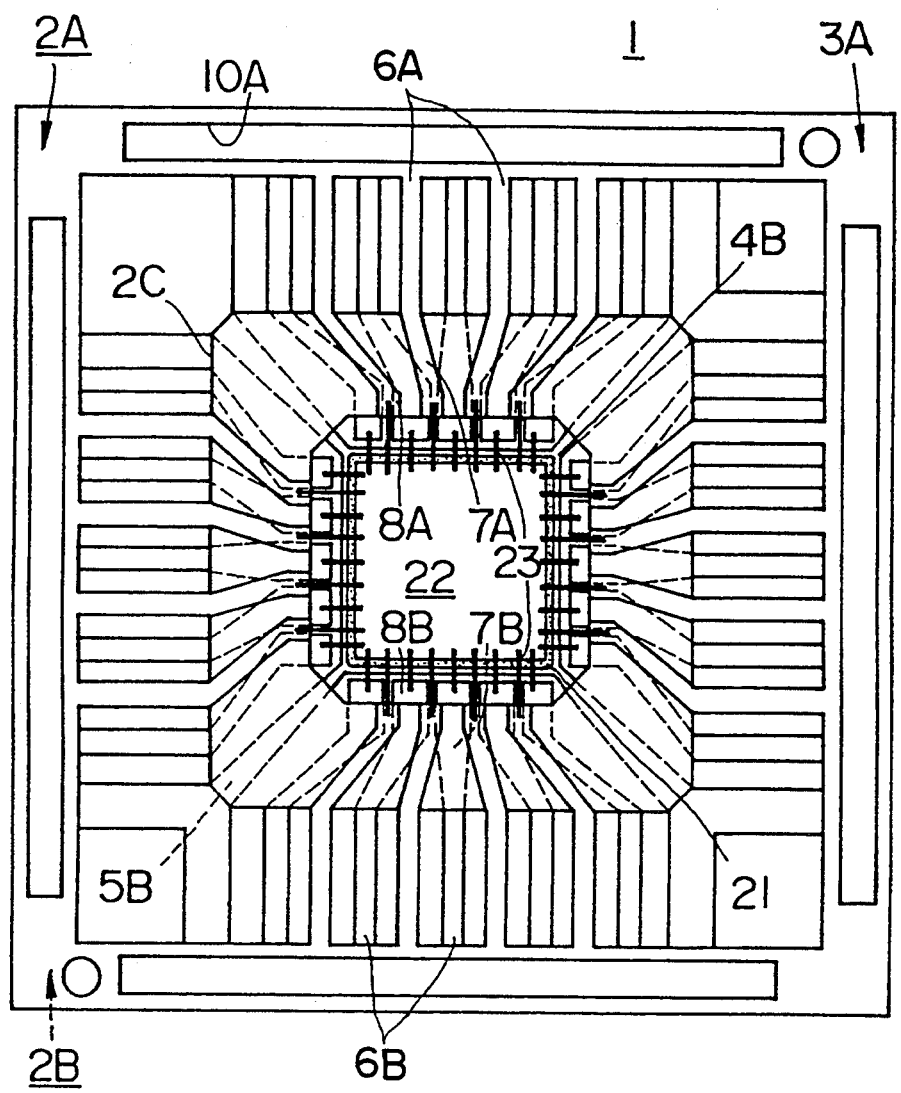
FIG. 10 is a view showing the lead frame after a wire bonding process in the QFP IC fabricating method, in which
(a) is a plan view and
(b) is a front sectional view.
Figure 10B:
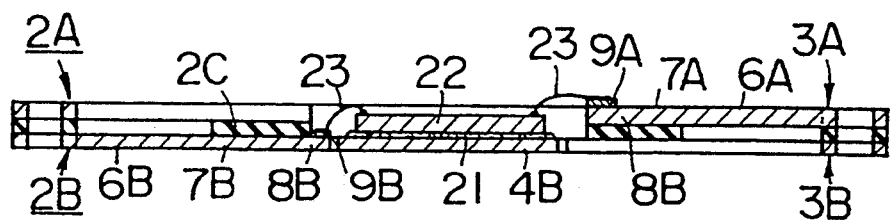

Then, in the wire bonding process, as shown in FIG. 10, between the inner leads 7A, 7B of the upper and lower lead frames 2A, 2B and a plurality of electrodes (bonding pads) formed on the main surface of the pellet 22, wires 23 are bonded at both ends thereof bridgewise to the bonding areas 8A, 8B of the upper and lower inner leads 7A, 7B and the bonding pads on the pellet 22.

In this case, since the silver plated layers 9A and 9B are formed on the bonding areas 8A and 8B of the inner leads 7A and 7B, the wires 23 are bonded in an extremely high bondability to the bonding areas 8A and 8B through the silver plated layers 9A and 9B.

It is optional which of the nail head bonding method and the wedge bonding method is to be adopted for carrying out the wire bonding work.

Particularly, in the case where the wire bonding work is carried out by the nail head bonding method, because of a narrow pitch on the pellet 22, it is necessary to set the ball diameter smaller than that in the conventional nail head bonding method. For example, when the ball diameter in the conventional nail head bonding method is 90 μm and when the same method is adopted in this embodiment, it is desirable that the ball diameter be set at 70 μm or so in terms of a ball diameter after pressure bonding.

In the case where the conventional wedge bonding method is adopted, no special consideration is needed because the pitch is set at a value smaller than 70 μm.

In point of working efficiency it is better to perform the wire bonding work separately for the inner leads 7A of the upper lead frame 2A and the inner leads 7B of the lower lead frame 2B. This is because a higher working efficiency is attained in the case of conducting the wire bonding work for each plane rather than conducting it alternately for two upper and lower stages.

As to in what order the wire bonding work is to be performed, the same work should be done first for the inner leads 7B of the lower lead frame 2B from the standpoint of working efficiency. This is because the temperature of the inner leads 7B reaches a predetermined bondable temperature earlier than the inner leads 7A of the upper lead frame 2A and thus permits earlier start of the wire bonding work.

During the execution of wire bonding for the lower lead frame 2B, the temperature of the inner leads 7A of the upper lead frame 2A will reach the bondable temperature.

Between adjacent inner leads 7B and 7B each upper inner lead 7A is disposed on the insulating layer 2C, so when wire 23 is bonded to the bonding area 8A of the upper inner lead 7A, it is likely that the bonding will not be carried out properly. This is because the pressing force and ultrasonic energy for pressure-bonding the wire 23 to the bonding area 8A cannot be borne by the space between the lower inner leads 7B and 7B located below the insulating layer 2C, in other words, a rigid member for catching a reaction force is not present under the upper bonding area 8A.

Figure 11A:
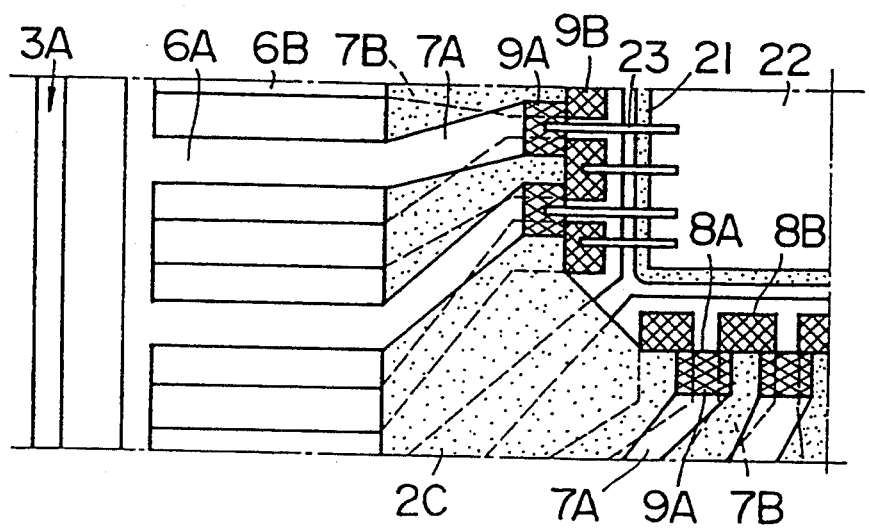
FIG. 11 is a view for explaining the operation, in which
(a) is an enlarged partial plan view,
(b) is an enlarged, partial, front sectional view and
(c) is an enlarged, partial, side sectional view.
Figure 11B:
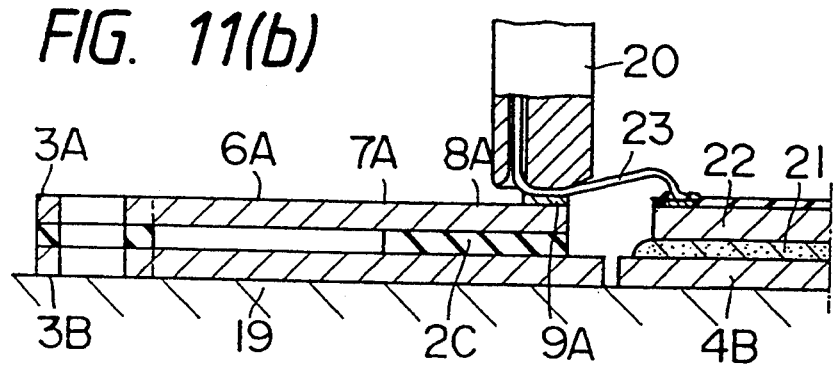
Figure 11C:
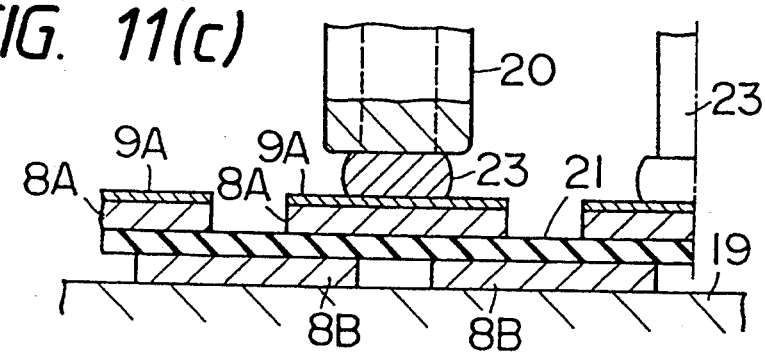

In this embodiment, however, as shown in FIG. 11, since both end portions in the circumferential direction of the bonding area 8A of each upper inner lead 7A overlap circumferential end portions of adjacent lower inner leads 7B, 7B, a reaction force required for bonding wire to the bonding area 8A of the upper inner lead 7A is obtained by the lower inner leads 7B, 7B through both overlapped portions. [See FIG. 11(c).]

For example, in the case where the wedge bonding method is used, one end portion of wire 23 is brought into pressure contact with an upper inner lead 7A by means of a wedge 20, and ultrasonic energy is also applied thereto. At this time, since both circumferential end portions of the bonding area 8A of the upper inner lead 7A overlap adjacent lower inner leads 7B, 7B, the pressing force and ultrasonic energy applied to the wire 23 by means of the wedge 20 are received by a bonding table 19 through the underlying insulating layer 2C and overlapped portions of the lower inner leads 7B, 7B.

Thus, the wedge 20 can make the bonding table 19 take charge of receiving the reaction of the pressing force and ultrasonic energy through the overlapped portions of the lower inner leads 7B, 7B which are rigid bodies, so it is possible to effect wire bonding also for the bonding area 8A of the upper inner leads 7A disposed between the inner leads 7B and 7B.

Thus, in this embodiment, also during the wire bonding work for the bonding area 8A of each upper inner lead 7A, the pressing force in wire bonding is sure to be borne by adjacent lower inner leads 7B, 7B, and therefore it is possible to effect wire bonding for the upper inner lead 7A in high bondability even if the upper inner lead is located between the adjacent lower inner leads 7B and 7B.

As a result of the pellet bonding work and wire bonding work described above, the integrated circuit formed in the pellet 22 now assumes a state of being electrically drawn out to the exterior through the bonding pads, wires 23, inner leads 7A and outer leads 6A, inner leads 7B and outer leads 6B.

Figure 12:
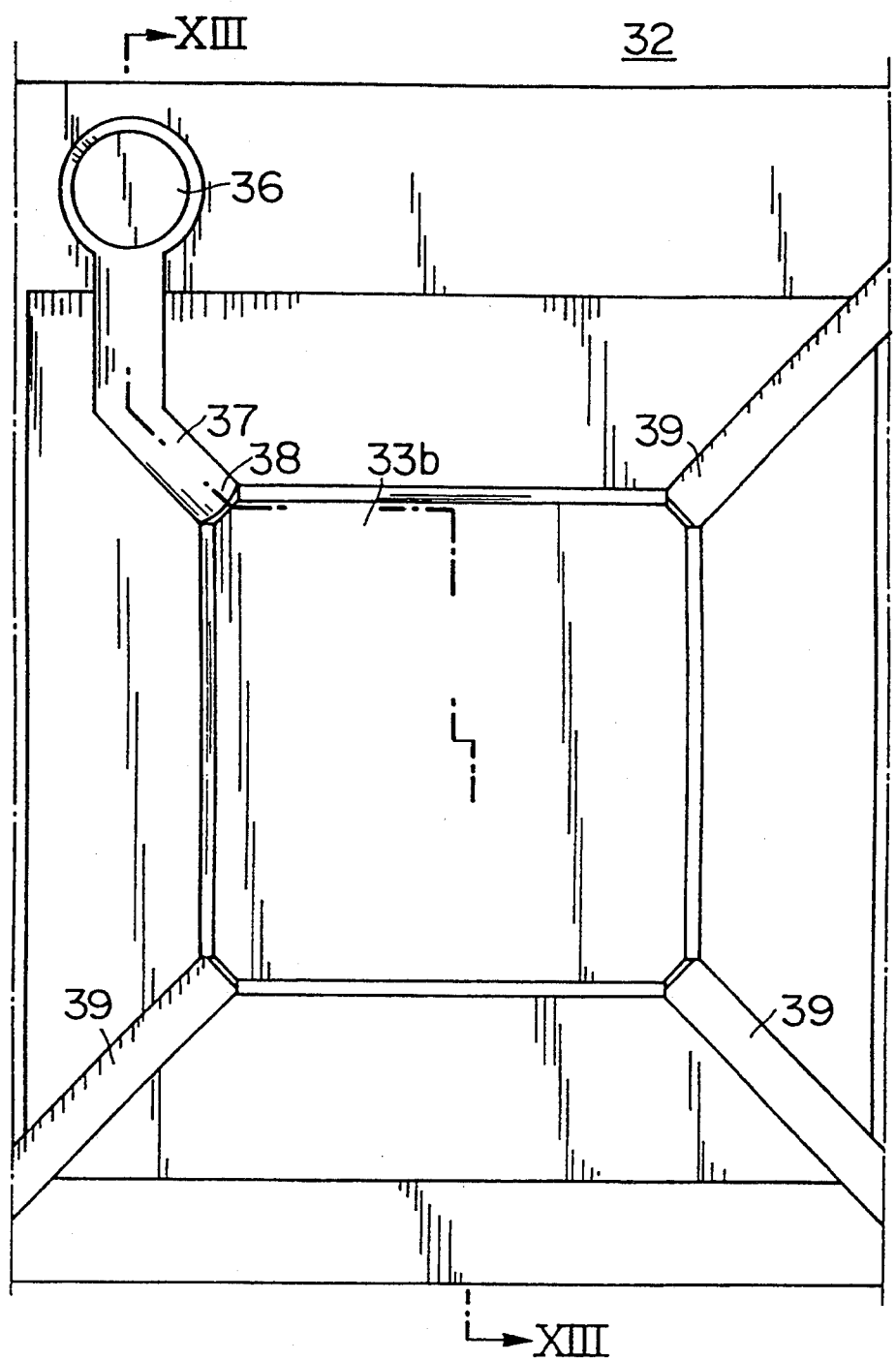
FIG. 12 is a partial plan view of a lower mold in a transfer molding apparatus.
Figure 13:
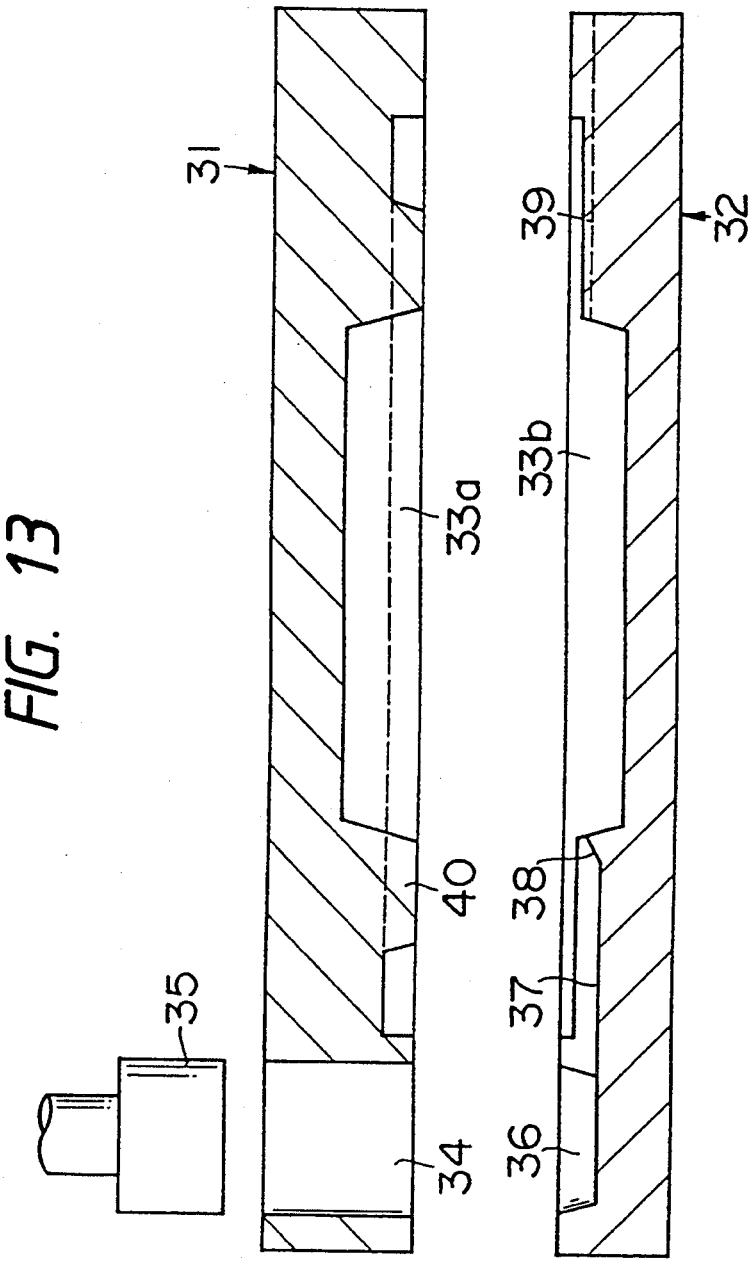
FIG. 13 is a side sectional view of the transfer molding apparatus, corresponding to a sectional view taken along line XIII—XIII in FIG. 12.
Figure 14:
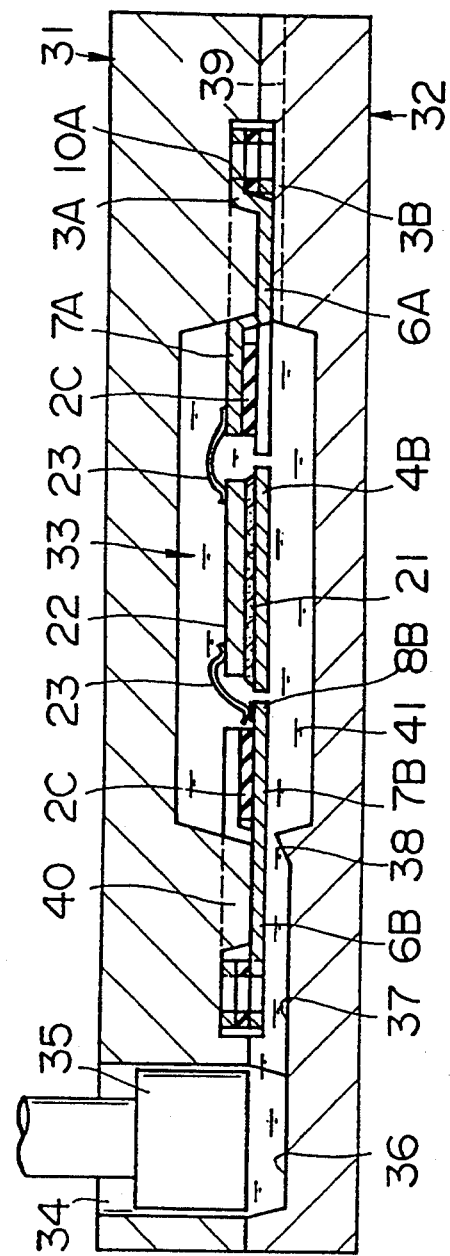
FIG. 14 is a side sectional view showing a transfer molding process.

Thereafter, the resin sealing body 24 is molded to the laminated lead frame 1 using such a transfer molding apparatus 30 as shown in FIGS. 12, 13 and 14.

The transfer molding apparatus 30 shown in FIGS. 12, 13 and 14 is provided with a pair of upper mold 31 and lower mold 32 which are clamped together by means of a cylinder device (not shown) or the like, and plural upper and lower cavity recesses 33a, 33b are formed in the mating surfaces of the upper and lower molds 31, 32, the cavity recesses 33a and 33b cooperating with each other to form a cavity 33.

In the mating surface of the upper mold 31 is formed a pot 34, and a plunger 35 which is extended and retracted by means of a cylinder device (not shown) is inserted into the pot 34 so as to permit the supply of resin as a molding material.

In the mating surface of the lower mold 32 is embedded a cull 36 in the position opposed to the pot 34, and also embedded is a runner 37 which extends radially for connection with the pot 34. The end of the runner 37 opposite to the end thereof connected to the pot 34 is connected to one corner of the lower cavity recess 33b, and in this connected corner portion there is formed a gate 38 so as to permit pouring of the resin into the cavity 33.

In the mating surface of the lower mold 32, moreover, three air vents 39 are formed in a buried state for connection with three corners of the lower cavity recess 33b and for communication with the interior of the cavity 33.

On the other hand, on the mating surface of the upper mold 31 is formed an outer lead bending portion 40 for bending the upper outer leads 6A, in a downwardly projecting state at a predetermined height almost equal to the thickness of both upper lead frame 2A and insulating layer 2C. The outer lead bending portion 40 is defined generally in the shape of a square frame by the spacing between the outer frames 3A, 3B of the laminated lead frame 1 and the outermost peripheries of the inner leads 7A, 7B of the frame 1.

The following description is now provided about the operation for transfer-molding the resin sealing body 24 using the laminated lead frame 1 of the above construction. First, the laminated lead frame 1 is set on the lower mold 32 so that the pellet 22 is received within the cavity 33. Then, the upper and lower molds 31, 32 are clamped together. At this time, since the outer lead bending portion 40 is projectingly provided on the mating surface of the upper mold 31, the outer leads 6A of the upper lead frame 2A in the laminated lead frame 1 are bent while being pressed against the lower mold 32, whereby the upper outer leads 6A are made flush with the lower outer leads 6B.

At this time, since slits 10A are formed in the outer frame 3A of the upper lead frame 2A each nearly throughout the overall length, a tensile tress induced upon bending of the outer leads 6A is absorbed by the slit 10A. Therefore, the upper inner leads 7A properly hold their positions above the lower inner leads 7B.

Thereafter, the resin, indicated at 41, is charged into the cavity 33 from the pot 34 through the runner 37 and gate 38 by means of the plunger 35. Since the air in the cavity 33 is discharged from the air vents 39, the resin 41 is charged smoothly into the cavity 33.

The resin 41 thus charged into the cavity 33 tries to leak out from the cavity 33 through the gap between adjacent outer leads 6A and 6B at the mating surfaces of the upper and lower molds 31, 32. Leakage of the resin 41 from such gap between the outer leads 6A and 6B would result in formation of a thick resin burr.

In this embodiment, however, since the outer frames 3A, 3B and outer frame portion 3C of the insulating layer are clamped strongly between the upper and lower molds 31, 32, the outer frame portion 3C of the insulating layer functions like a gasket, so that the gaps outside the cavity 33 at the mating surfaces of the upper and lower molds 31, 32 maintains an extremely high airtightness.

Consequently, even if the resin 41 charged into the cavity 33 tries to leak out from the gap between the outer leads 6A and 6B, the resin is pressed by the air staying in the gap because the air is not discharged, thus preventing the leakage of the resin.

Thus, in this embodiment, since it is possible to prevent the resin charged into the cavity 33 from leaking to the exterior through the gap between adjacent outer leads 6A and 6B, it is possible to prevent the formation of a thick resin burr between those outer leads.

In other words, the outer frame portion 3C formed of resin plays the role of a dam which prevents the leakage of the resin 41 from the cavity 33. Consequently, it is not necessary to form a dam for preventing the leakage of the resin 41 on the laminated lead frame 1 or the upper and lower molds 31, 32.

After charging into the cavity 33, the resin 41 is hardened thermally, whereupon the resin sealing body 24 is formed by the cavity 33.

Thereafter, the upper and lower molds 31, 32 are opened and the resin sealing body 24 is released from the cavity 33 by means of an ejector pin (not shown). Then, the laminated lead frame 1 with the resin sealing body 24 thus molded thereto is removed from the transfer molding apparatus 30.

Figure 15A:
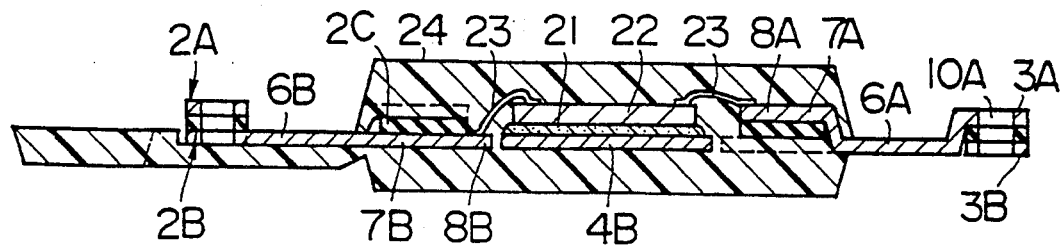
FIG. 15(a) is a side sectional view showing a state after the transfer molding process.

In this way, tab 4B, pellet 22, upper inner leads 7A, lower inner leads 7B and wires 23 are resin-sealed in the interior the resin sealing body 24 thus formed, as shown in FIG. 15(a).

Figure 15B:
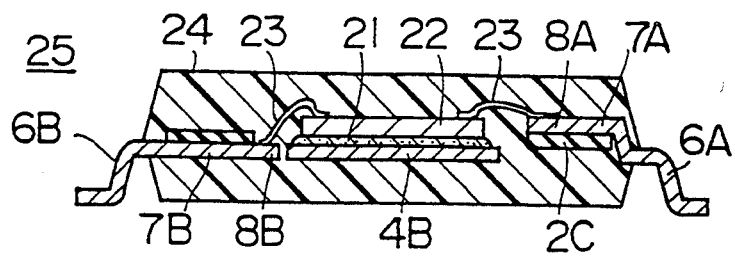
FIG. 15(b) is a side sectional view showing a state after an outer lead cutting and bending process and
FIG. 15(c) is a partially cut-away front view showing a state after mounting.

Then, in a lead cutting and bending process, as shown in FIG. 15(b), the outer frames 3A and 3B are cut off from the laminated lead frame 1 with the resin sealing body 24 thus molded thereto, and the outer leads 6A and 6B are bent in the shape of gull wing for example. The gull wing shape is obtained by first bending the outer leads 6A and 6B in a direction approximately perpendicular to the main surface of the pellet 22 and then bending the outer ends of the outer leads 6A and 6B in a direction away from the pellet 22 and nearly in parallel with the main surface of the pellet. The QFP IC 25 having the foregoing construction is thus obtained.

In the lead cutting and bending process, the outer leads 6A and 6B of the QFP IC 25 are formed in such a manner that their outer end portions, namely, their mounting faces, are present in the same plane, for realizing the surface mounting of the QFP IC 25 in a simple manner as will be described later.

Figure 15C:
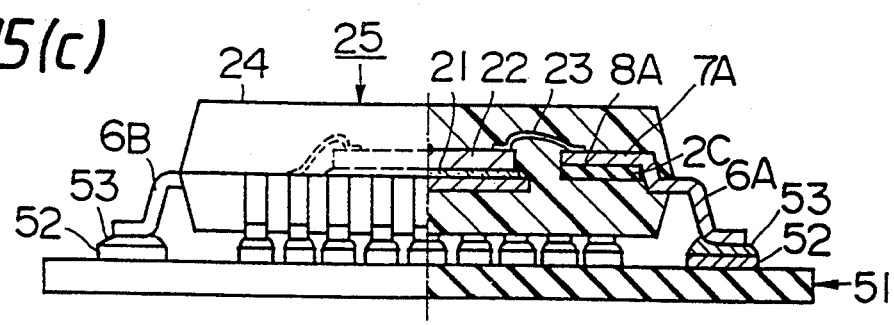

The resin-sealed type QFP IC 25 thus fabricated is then surface-mounted on a printed circuit board, as shown in FIGS. 2 and 15(c).

In FIGS. 2 and 15(c), a plurality of lands 52 are formed on a printed circuit board 51 in a corresponding relation to the outer leads 6A and 6B in the resin-sealed QFP IC 25 to be mounted. The lands 52 are each formed in the shape of a generally rectangular thin plate using a solder material.

In mounting the QFP IC 25 having the foregoing construction onto the printed circuit board 51, the outer leads 6A and 6B of the IC 25 are brought into abutment respectively with the lands 52 in a registered manner.

Thereafter, the outer leads 6A, 6B and the lands 52 are subjected to a reflow soldering treatment, whereby solder-filled layers 53 are formed between the outer leads and the lands. The solder-filled layers 53 provide an electric and mechanical connection between the QFP IC 25 and the printed circuit board 51.

In this way the IC 25 is surface-mounted onto the printed circuit board 51. The surface mounting operation can be done in a simple manner because the outer leads 6A and 6B of the IC 25 have been formed so that their mounting faces are present in the same plane.

Before shipping, the QFP IC constructed as above is subjected to an electrical characteristic test and an environmental test. When the IC is electrified in these tests, terminals as measuring elements in an inspection apparatus are contacted with the lower end faces of the outer leads, whereby the IC and a tester of the inspection apparatus are electrically connected with each other. At this time, if side faces of adjacent outer leads are in contact with each other, there will occur a short between the outer leads and hence the IC will be judged to be defective.

Figure 1B:
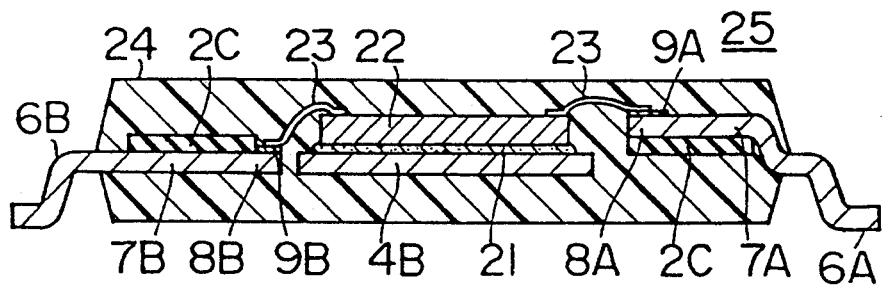

In this embodiment, however, a sufficient spacing is ensured between adjacent outer leads 6A and 6B, as shown in FIG. 1, so there is no fear of short-circuit between the adjacent outer leads.

Further, since adjacent terminals of the inspection apparatus assume a properly connected electrically to the outer leads, the inspection is carried out as usual. Thus, the QFP IC can undergo the electrical inspection effectively, with the result that the yield is improved.

The following effects are obtained by the above embodiment.

① Since the inner lead group comprises a group of upper inner leads 7A in an upper plane and a group of lower inner leads 7B in a lower plane and the upper and lower inner leads 7A, 7B are arranged in an alternate manner, the pitch between inner leads can be reduced to half. Consequently, when the package size is fixed, it is impossible to increase the number of pins.

② Both end portions in the circumferential direction of each upper inner lead 7A overlap circumferential end portions of underlying adjacent lower inner leads 7B, 7B located on both sides of the upper inner lead, so when the wire bonding is performed for the upper inner lead 7A, the resulting reaction force for the upper inner lead is borne at the overlapped portions of the lower inner leads 7B, 7B thus resulting in that the wire bonding can be done properly despite the upper inner lead 7A is disposed between the lower inner leads 7B and 7B.

③ The use of the resin sealing body permits a great reduction of the manufacturing cost in comparison with PGA.

④ Since the outer leads 6A and 6B are arranged so that their mounting faces are present in the same plane, the mounting work efficiency for the printed circuit board 41 is not impaired dispite the inner leads 7A and 7B are arranged in two stages.

⑤ The spacing between adjacent outer leads 6A and 6B can be ensured suffieciently large even in the cases where the number of pins is large, so in the electrical characteristic test it is possible to connect terminals of the inspection apparatus effectively to the adjacent outer leads 6A and 6B, thus making it possible to execute the inspection properly. As a result, the production yield can be improved.

⑥ The laminated lead frame 1 can be fabricated in a simple and precise manner by applying a lithography treatment to the laminate 11 with conductor layers 12A and 12B laminated to the surface and the back of the insulating layer 12C.

⑦ At the time of molding of the resin sealing body 24, the outer frame portion 3C of the insulating layer formed using resin at the outer frame portion of the laminated lead frame 1 functions like a gasket due to its elasticity, whereby the resin 41 charged into the cavity 33 can be prevented from leaking to the exterior of the cavity 33 through the gap between adjacent outer leads 6A and 6B, and hence it is possible to prevent the formation of resin burr between the outer leads.

⑧ Since the formation of resin burr can be prevented as mentioned in the above ⑦, it is not required to form a dam on the laminated lead frame 1 or the upper and lower molds 31, 32.

Although the present invention has been described above concretely by way of an embodiment thereof, it goes without saying that the invention is not limited to the above embodiment and that various modifications may be made within the scope not departing from the gist of the invention.

Figure 16A:
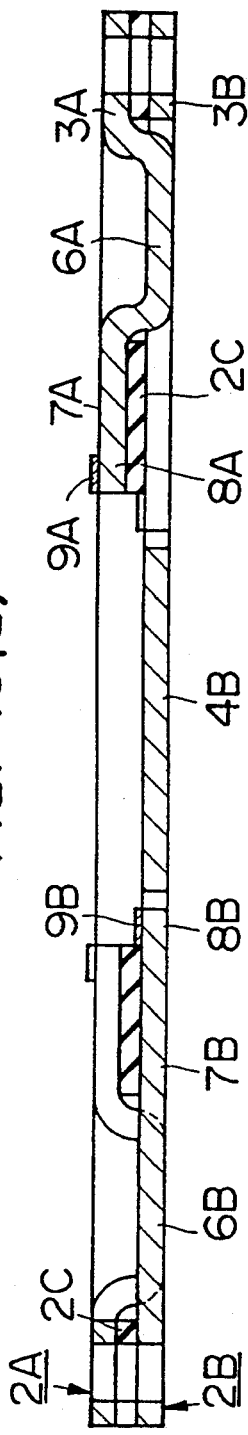
FIGS. 16(a) and 16(b) comprises front sectional views each showing a laminated lead frame further embodying the present invention.

For example, the lead bending operation for arranging the projecting outlets of the upper and lower outer leads 6A, 6B from the resin sealing body 24 in the same plane need not always be carried out simultaneously in the resin molding process. It may be done in the stage of the laminated lead frame 1, as shown in FIG. 16(a); that is, a process of bending the outer lead 6A or 6B is carried out after formation of the laminated lead frame 1 in FIG. 8.

Moreover, it is not always necessary to bend the upper outer leads 6A to the lower outer leads 6B side. Construction may be made so that the lower outer leads 6B are bent to the upper outer leads 6A.

Figure 16B:
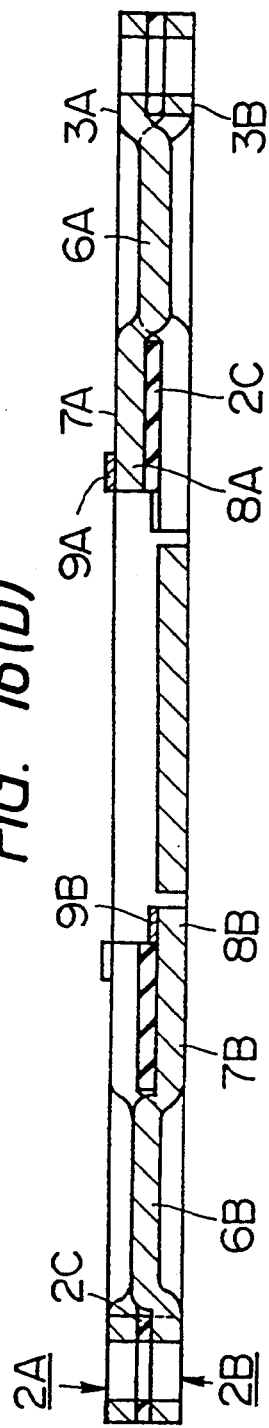

Further, the upper and lower outer leads 6A, 6B may each be bent half, as shown in FIG. 16(b). In this case, since the degree of bending is half, the stress imposed on one lead is smaller than that imposed on a fully bent lead in the case of fully bending either the upper or the lower outer lead.

The upper and lower outer leads 6A, 6B need not always be projected in the same plane from the resin sealing body 24. They may be projected from upper and lower positions, respectively.

The material of the insulating layer is not limited to an epoxy resin. There also may be used such other resins as polyurethane resins and polyimide resins, as well as quartz glass and insulating conductors.

Although in the above description the present invention was applied to the resin-molded type QFP IC belonging to the background utilization field thereof, this constitutes no limitation and the invention is also applicable to semiconductor devices at large, including IC provided with a resin-sealed type package and transistors.

The following is a brief explanation of effects obtained by typical inventions out of those disclosed herein.

Since the inner lead group comprises a group of upper inner leads in upper plane and a group of lower inner leads in a lower plane and the upper and the lower inner lead group are arranged in an alternate manner, the pitch between inner leads can be reduced to half. Consquently, when the package size is fixed, it is possible to increase the number of pins.

Further, both end portions in the circumferential direction of each upper inner lead overlap circumferential end portions of underlying adjacent lower inner leads located on both sides of the upper inner lead, so when wire bonding is performed for the upper inner lead, the resulting reaction force for the upper inner lead is borne at the overlapped portions of the lower inner leads and hence it is possible to properly effect the wire bonding for the upper inner lead.

What is claimed is:

1. A method of fabricating a semiconductor device, comprising the steps of:
   providing a laminated lead frame comprising first and second lead frames laminated to each other, said first and second lead frames each comprising a plurality of inner leads and a plurality of outer leads contiguous to said inner leads respectively in an integral manner, said inner leads each including a bonding area defined by the innermost end and side portions of the inner lead, with an insulating layer being interposed at least between the inner leads of said first lead frame and the inner leads of said second lead frame;
   providing a semiconductor pellet having an electronic circuitry formed in a main surface thereof and a plurality of electrodes disposed on the main surface;
   connecting said plural electrodes with the bonding areas of the inner leads of said first and second lead frames electrically using a plurality of wires; and
   sealing the inner leads of said first and second lead frames, said insulating layer and said semiconductor pellet by means of resin;
   wherein at least the bonding area of each inner lead of said first lead frame is positioned above two adjacent inner leads of said second lead frame in such a manner that side portions thereof overlap said two adjacent inner leads of the second lead frame.

2. A method of fabricating a semiconductor device according to claim 1, further comprising the step of bending said outer leads nearly perpendicularly to the main surface of said pellet.

3. A method of fabricating a semiconductor device according to claim 2, further comprising the step of bending the outer end portions of said outer leads in a direction approximately parallel to the main surface of said pellet and away from the pellet.

4. A method of fabricating a semiconductor device according to claim 1, wherein wire bonding for said first lead frame is carried out after the execution of wire bonding for said second lead frame.

5. A method of fabricating a semiconductor device according to claim 1, wherein in said sealing step the outer leads of said first lead frame are pressed in a single plane by upper and lower molds.

6. A method of fabricating a semiconductor device according to claim 1, wherein said second lead frame underlies said first lead frame, and the bonding areas of the inner leads of the second lead frame are not covered with said insulating layer.

7. A method of fabricating a semiconductor device according to claim 1, wherein at least the bonding area of each inner lead of said first lead frame is positioned above two adjacent inner leads of said second lead frame in such a manner that side portions thereof overlap said two adjacent inner leads of the second lead frame.

8. A method of fabricating a lead frame, comprising the steps of:
   providing a laminate comprising a first conductor layer and a second conductor layer formed respectively on both sides of an insulating layer;
   etching said first and second conductor layers to form first and second lead frames, said first and second lead frames each comprising a plurality of inner leads and a plurality of outer leads contiguous respectively to the inner leads in an integral manner, said inner leads each including a bonding area defined by the innermost end and side portions of the inner lead; and
   etching said insulating layer to expose the bonding areas of said second lead frame,
   wherein at least the bonding area of each inner lead of said first lead frame is positioned above two adjacent inner leads of said second lead frame in such a manner that side portions thereof overlap said two adjacent inner leads of the second lead frame.

9. A method of fabricating a lead frame according to claim 8, wherein in the insulating layer etching step, a pellet bonding portion is exposed simultaneously with the exposure of the bonding areas of the inner leads of said second lead frame.

10. A method of fabricating a lead frame according to claim 8, wherein said first and second conductor layers are etched toward said insulating layer from the respective sides opposite to the sides which are in contact with the insulating layer.

11. A method of fabricating a lead frame according to claim 8, further comprising the step of bending the outer leads of at least one of said first and second lead frames to make the outer leads of both first and second lead frames in a same plane with each other.

* * * * *